United States Patent [19]

Dantzler

[11] Patent Number: 4,991,098
[45] Date of Patent: Feb. 5, 1991

[54] COMPUTER-BASED CONTROLLER AND BIPOLAR PWM DRIVER ARRANGEMENT FOR AIR CORE GAUGE CONTROL

[75] Inventor: Maurice L. Dantzler, Kokomo, Ind.

[73] Assignee: General Motors Corporation, Detroit, Mich.

[21] Appl. No.: 275,879

[22] Filed: Nov. 25, 1988

[51] Int. Cl.$^5$ .............................................. G06F 9/00
[52] U.S. Cl. .............................. 364/424.01; 364/556; 324/140 R; 324/146
[58] Field of Search ........................ 364/424.01, 556; 340/870.19; 324/140 R, 146

[56] References Cited

U.S. PATENT DOCUMENTS

| | | | |
|---|---|---|---|
| 3,636,447 | 1/1972 | Gelenius | 324/140 R |
| 3,946,311 | 3/1976 | Baker et al. | 324/167 |
| 4,051,434 | 9/1977 | Sweet | 324/78 D |
| 4,167,699 | 9/1979 | Baker | 324/171 |
| 4,230,984 | 10/1980 | Taylor | 324/115 |
| 4,355,279 | 10/1982 | Younge | 324/161 |
| 4,630,043 | 12/1986 | Haubner et al. | 364/424.01 |
| 4,862,365 | 8/1989 | Onesti | 364/424.01 |
| 4,875,041 | 10/1989 | Dannenberg | 364/424.03 |

Primary Examiner—Parshotam S. Lall
Assistant Examiner—Tyrone Queen
Attorney, Agent, or Firm—Mark A. Navarre

[57] ABSTRACT

A control arrangement including a computer-based controller and bipolar driver for bidirectional current control of air core gauge coils by pulse-width-modulation (PWM). The computer-based controller processes input information to determine the desired deflection of the pointer, and looks-up previously stored PWM duty cycle commands for energizing the gauge coils. The bipolar drivers modulate the polarity of the voltage applied to the coils in accordance with the duty cycle commands. Since the drivers are bipolar, a zero strength magnetic field vector is achieved with a duty cycle command of 50 percent. This eliminates discontinuities in the region of zero strength magnetic field vector, and avoids the requirement of generating duty cycles of 0 percent and 100 percent to achieve a full 360 degrees of pointer deflection. Potential discontinuities in the generation of the duty cycles due to input data processing requirements is eliminated by scaling the duty cycles into the range of (DELTA)% to (100-DELTA)%.

4 Claims, 6 Drawing Sheets

COMPUTER-BASED CONTROLLER AND BIPOLAR PWM DRIVER ARRANGEMENT FOR AIR CORE GAUGE CONTROL

This invention relates to computer-based control of air core gauges for automotive instrumentation, and more particularly to a control arrangement therefor.

BACKGROUND OF THE INVENTION

In state of the art automotive instrumentation, electromechanical (pointer-type) displays are typically mechanized with two-coil air core gauges. Each coil is energized with current to generate a magnetic field and a rotor magnet attached to the pointer aligns the pointer with the resultant magnetic field vector.

Air core gauges are typically driven by a dedicated circuit which energizes the coils to develop predetermined current levels as a function of the desired deflection of the pointer. Assuming an orthogonal orientation of the coils, a given deflection DEFL with respect to a vertical axis is achieved with a vertical coil current proportional to cos(DEFL) and a horizontal coil current proportional to sin(DEFL). By providing for bidirectional current, deflections of up to 360 degrees may be achieved.

SUMMARY OF THE PRESENT INVENTION

The present invention is directed to a control arrangement including a computer-based controller and bipolar driver for bidirectional current control of air core gauge coils by pulse-width-modulation (PWM) of a DC source. The computer-based controller processes input information (in the form of a frequency, analog voltage, etc.) to determine the desired deflection of the pointer and generating a control signal for the bipolar driver which is representative of a desired coil current which will produce the desired deflection.

The control signal is generated in the format of a bipolar PWM duty cycle and the bipolar driver applies the voltage of the source to the coils in alternating polarity in accordance with the duty cycle of the control signal. Duty cycles in the range of 0% to 50% define the full range of negative coil current and duty cycles in the range of 50% to 100% define the full range of positive coil current.

To eliminate potential discontinuities in the generation of the control signals due to input data processing duties, the desired current duty cycle values generated by the computer-based control unit are scaled into the range of (DELTA)% to (100-DELTA)%. The term DELTA is defined in relation to the time required by the control unit to receive and process the input data and may also be scheduled to regulate the magnitude of the resultant magnetic field vector and thus the pointer alignment torque.

The bipolar control format eliminates discontinuities in the region of the zero strength magnetic field vector and the scaling technique permits the achievement of 360 degrees of pointer deflection without having to generate duty cycle commands of 0% and 100%. The latter point is significant because generation of very low and very high duty cycles is typically difficult to harmonize with the processing duties of computer-based controllers.

With the arrangement of this invention, a single computer-based controller can control several gauges, limited only by the processing requirements, the throughput capability of the controller and hardware limitations, if any.

BRIEF DESCRIPTION OF THE DRAWINGS

FIG. 1b is a graph representing the coil current vs. pointer deflection of the air core gauge of FIG. 1a.

DETAILED DESCRIPTION OF THE INVENTION

Figure 1A:
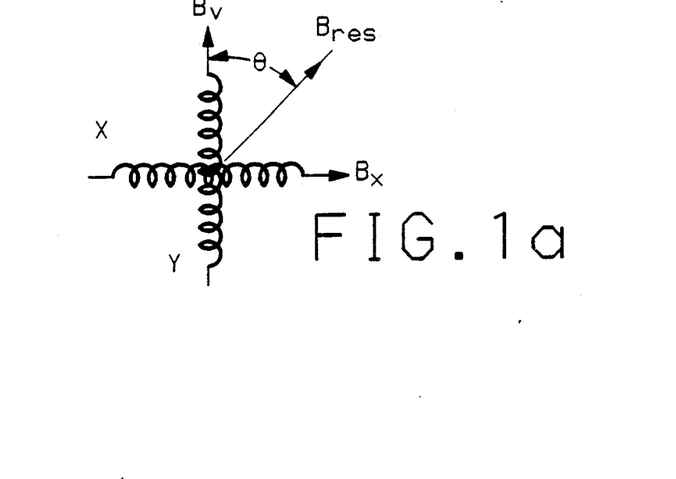
FIG. 1a is a schematic representation of an air core gauge.

Referring to the drawings, and more particularly to FIG. 1a, the two orthogonal coils of a conventional air core gauge are designated as X and Y. Each coil X, Y generates a magnetic field vector $B_x$, $B_y$ in relation to the magnitude and direction of current therein. The two field vectors $B_x$, $B_y$ combine to produce a resultant magnetic field vector $B_{res}$ which correspondingly deflects a rotor magnet assembly (not shown) attached to the pointer.

Figure 1B:
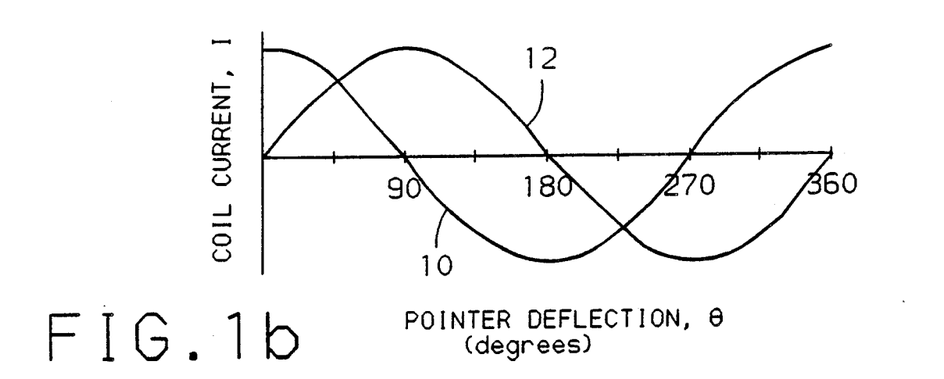

The angular deflection DEFL of the pointer as defined in FIG. 1a is depicted in FIG. 1b as a function of the currents supplied to the X and Y coils. On a linear scale of deflection, the current supplied to the Y coil is scheduled in relation to the cosine of the angle DEFL, designated by the trace 10. The current supplied to the X coil, on the other hand, is scheduled in relation to the sine of the angle DEFL, designated by the trace 12. Thus, any controller of an air core gauge must be capable of determining the sine and cosine of the desired angle of deflection and supplying corresponding currents to the coils X and Y.

The relative magnitudes and directions of the currents in coils X and Y determine the direction of the resultant magnetic field vector $B_{res}$ and hence the pointer deflection. Variations in the absolute magnitudes of the currents (as due to power supply variations) affect only the magnitude of the resultant magnetic field vector $B_{res}$ which pertains to the pointer aligning torque.

Figure 2A:
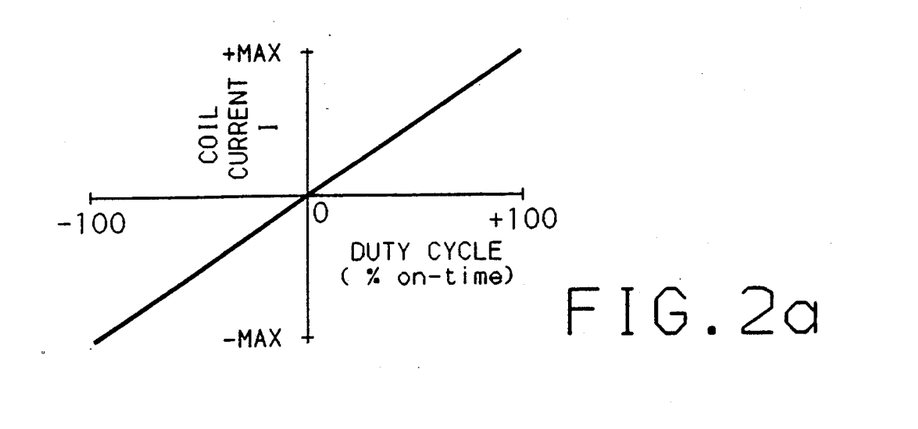
FIGS. 2a and 2b graphically represent a conventional control arrangement in which direction and PWM duty cycle are controlled in accordance with the desired pointer deflection.
Figure 2B:
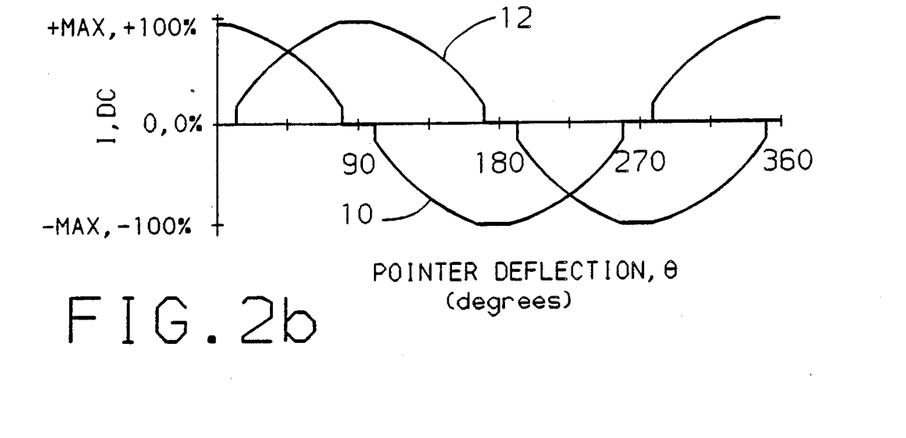

In digital control, current regulation is conveniently mechanized by pulse-width-modulation (PWM) of the applied voltage. FIGS. 2a-2b illustrate a conventional PWM arrangement in which the duty cycle (DC), or percent on-time, is scheduled as a nearly direct function of the desired coil current. As depicted in the graph of FIG. 2a, a duty cycle of 0% (no on-time) results in zero coil current; a duty cycle of 100% (no off-time) results in maximum coil current. With this arrangement, the controller must schedule not only the duty cycle (DC), but also the current direction since the full range of 0%–100% duty cycle is available for both directions of current. The PWM driver in such arrangement may be a conventional bridge, commonly referred to as an H-switch.

FIG. 2b illustrates the relation between the PWM duty cycle (DC) and the angle of deflection DEFL of the pointer for the PWM arrangement described in reference to FIG. 2a. Positive current corresponds to positive duty cycle; negative current corresponds to negative duty cycle. As in FIG. 1b, the cosine trace 10 represents the current for the Y coil and the sine trace 12 represents the current for the X coil. To achieve a pointer deflection of 90 degrees, for example, the Y coil is energized at a duty cycle of 0% and the X coil is energized at a duty cycle of 100%.

The control arrangement described above is conveniently mechanized with a dedicated digital logic circuit due to its parallel processing capability. One part of the circuit can be processing input data while another part processes output data.

However, problems are encountered in computer-based mechanizations due to the limitations of serial processing. For example, frequency inputs (such as for vehicle or engine speed) are typically decoded by counting the output pulses of a relatively high frequency free running oscillator between pulses of the lower frequency input, such count being inversely related to the sensed speed. To avoid the use of external circuitry, such processing is normally carried out by the computer, using its interrupt capability. In other words, each leading (or trailing) edge of the input data signals the computer-based controller to interrupt its current duties to process the input data. Servicing of such interrupts creates what is commonly known as interrupt latency, which potentially increases the time required for the computer to perform any regularly scheduled task, such as outputting PWM data.

The interrupt latency referred to above effectively limits the range of PWM duty cycles that can be reliably generated by the computer-based controller. This is because the controller cannot service an input data interrupt request and schedule the on-to-off and off-to-on PWM transitions at the same time. As a result, there may be control discontinuities in the areas of 0, 90, 180 and 270 degrees pointer displacement, as designated by the stepped zero crossings and clipped peaks in FIG. 2b.

The above-described problem of computer-based control are overcome according to the present invention with a bipolar driver which modulates the polarity of the applied voltage in accordance with the scheduled duty cycle. This produces the characteristic graphically depicted in FIG. 3a, where the net or average coil current over the PWM period is plotted as a function of duty cycle. In this case, a duty cycle of 50% results in a net coil current and hence a net resultant magnetic field vector $B_{res}$, of zero. A duty cycle of 0% results in the maximum negative coil current; and a duty cycle of 100% results in the maximum positive coil current.

Although the applied voltage reverses once per PWM period, pointer jitter is avoided so long as the PWM frequency is greater than the mechanical time constant of the pointer and rotor magnet assembly. Upper limitations on the PWM frequency are related to the electrical time constant of the air core gauge coils. In a mechanization of the present invention, a PWM frequency of 256 Hz was found to be satisfactory for an automotive speedometer gauge.

Figure 3A:
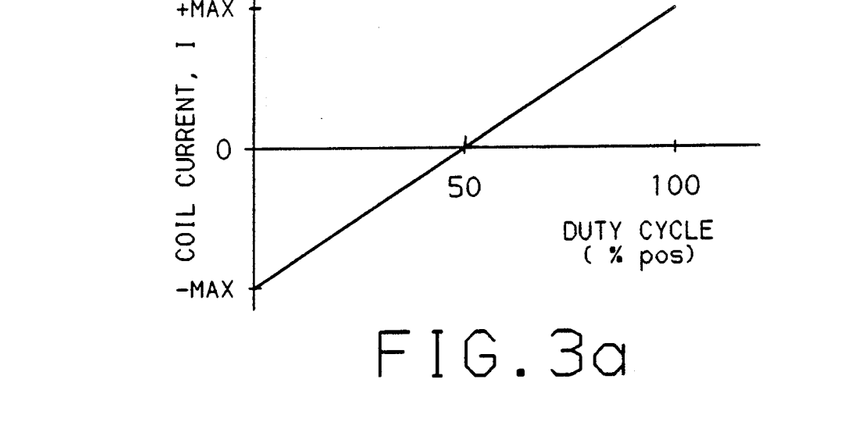
FIGS. 3a, 3b and 3c graphically represent the control arrangement of this invention in which the PWM duty cycle is scheduled to control both coil current magnitude and direction.
Figure 3B:
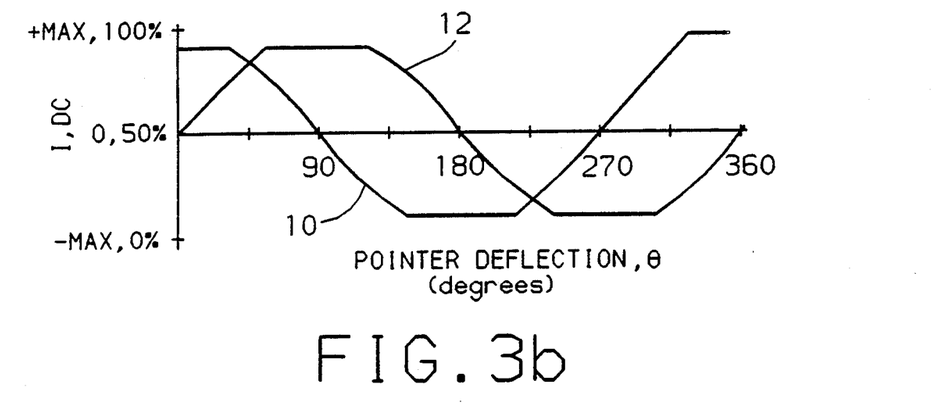

FIG. 3b illustrates the relation between the PWM duty cycle (DC) and the angle of deflection DEFL of the pointer P for the PWM arrangement of this invention described in reference to FIG. 3a. As in FIGS. 1b and 2b, the cosine trace 10 represents the current for the Y coil and the sine trace 12 represents the current for the X coil. Here however, the duty cycle ranges between 0% and 100% and no current direction signal is required.

Significantly, the regions of small and large duty cycle commands occur solely at the maximum current values (as opposed to the zero crossings), as designated by the clipped peaks in FIG. 3b. While this represents a distortion in the current waveforms, such distortion is avoided according to the present invention by scaling the range of duty cycles as graphically depicted in FIG. 3c. With this approach, the peak positive current is achieved with a PWM duty cycle of somewhat less than 100% and the peak negative current is achieved with a PWM duty cycle of somewhat greater than 0%. In each case, the duty cycle limit is offset from the nominal maximum value (0%, 100%) by an amount designated as DELTA, the minimum value of DELTA being related to the interrupt latency of the computer-based controller.

With the above control arrangement, PWM current regulation for the coils of an air core gauge can be accurately carried out by a computer-based controller, even though the controller must service interrupts for input data processing. The PWM frequency is selected to avoid pointer jitter and there is substantially no distortion of the generated current waveforms.

Although the restriction of allowable PWM duty cycles according to this invention reduces the net coil current (as opposed to the arrangement of FIGS. 2a and 2b) and hence the magnitude of the resultant magnetic torque vector, the pointer alignment was found to be adequate for standard automotive displays. In fact, the ability to control the net coil current by scheduling the value of DELTA is beneficial in that the magnitude of the torque vector may be matched to the pointer torque requirement. This ensures adequate responsiveness while avoiding jerky movement of the pointer.

Figure 4:
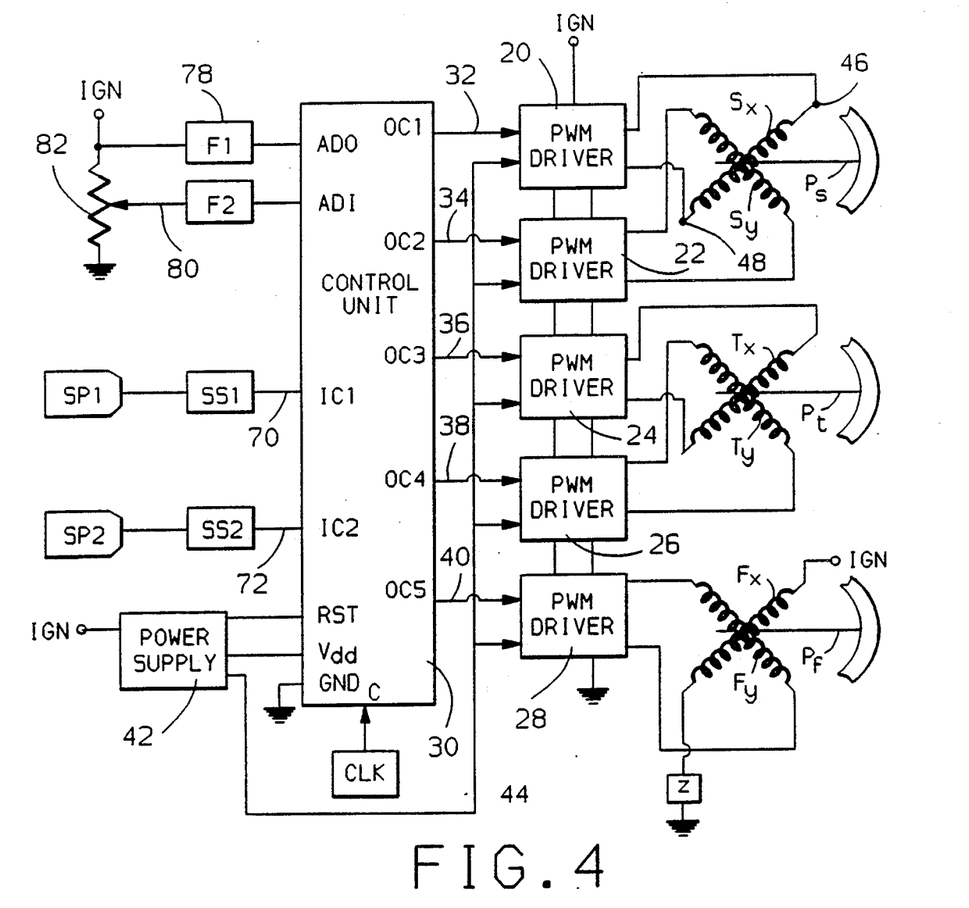
FIG. 4 is a system diagram of a computerbased controller and bipolar PWM driver arrangement according to this invention.

FIG. 4 depicts a computer-based controller and bipolar driver arrangement according to this invention for controlling a set of three air core gauges for driving speedometer (S), engine tachometer (T) and fuel level (F) displays. The gauges are each schematically represented by a pair of orthogonal coils $S_x$, $S_y$; $T_x$, $T_y$; $F_x$, $F_y$ and a pointer $P_s$, $P_t$, $P_f$ supported for angular displacement in relation to a suitable scale.

In gauges requiring a wide range of pointer deflection, such as the speedometer and tachometer gauges, both coils are PWMed as described above to provide a full 360 degree deflection capability. In a gauge requiring less pointer deflection, such as the fuel gauge, one coil $F_x$ is supplied with a constant current (from the vehicle ignition voltage IGN through the impedance Z) and the other coil is PWMed as described above to provide a deflection range approaching 180 degrees.

The PWMed coils $S_x$, $S_y$, $T_x$, $T_y$ and $F_y$ are driven by bipolar PWM driver circuits 20–28, which in turn, are controlled by the computer-based control unit 30 via lines 32–40. The clock CLK supplies the control unit 30 with a high frequency (8 MHz) clock signal, and the power supply circuit 42 supplies the control unit 30 with a 5-volt power source derived from the vehicle ignition voltage (IGN). The power supply 42 also generates a 5-volt inhibit signal (as explained below) for the driver circuits 20–28 on line 44, and a reset (RST) signal for control unit 30 which changes state upon closure of the vehicle ignition switch (not shown). Power for the driver circuits 20–28 is obtained directly from the ignition voltage (IGN).

Figure 5:
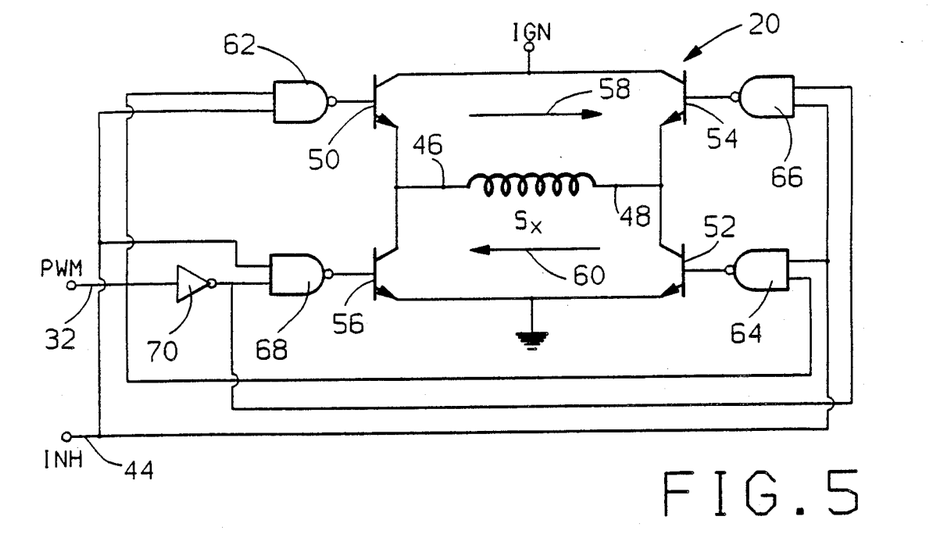
FIG. 5 is a circuit diagram of the bipolar PWM driver of FIG. 4.

The bipolar driver circuit 20 is depicted in detail in FIG. 5, where the reference numerals from FIG. 4 have been repeated as appropriate. The speedometer gauge coil $S_x$ is connected across the driver output terminals 46 and 48 as shown. The driver circuit 20 is defined by two pairs of power transistors 50, 52; 54, 56 which are biased conductive and nonconductive by the PWM input signal on line 32 to modulate the polarity of the voltage applied to the coil $S_x$. When the transistors 50 and 52 are conductive (transistors 54 and 56 nonconductive), the terminal 46 is substantially at the positive ignition voltage (IGN) and the terminal 48 is substantially at ground potential. This produces a positive coil current as designated by the arrow 58. When the transistors 54 and 56 are conductive (transistors 50 and 52 nonconductive), the terminal 48 is substantially at the positive ignition voltage (IGN) and the terminal 46 is substantially at ground potential. This produces a negative coil current as designated by the arrow 60.

Driver logic for the transistors 50–56 is performed by the AND gates 62–68 and the inverter 70. The PWM input signal on line 32 is connected directly as an input to the AND gates 62 and 64 and inverted as an input to the AND gates 66 and 68. The 5-volt inhibit signal INH on line 44 is applied as a second input to each of the AND gates 62–68. So long as vehicle ignition switch is closed, the inhibit signal on line 44 is high and the PWM input signal is passed directly (or inverted) to the power transistors 50–56. In such state, a logic one PWM input signal level produces conduction of transistors 50 and 52 to energize the coil $S_x$ with positive current. A logic zero PWM input signal level produces conduction of transistors 54 and 56 to energize the coil $S_x$ with negative current. When the ignition switch is open, the ignition voltage (IGN) disappears along with the inhibit signal on line 44 and the transistors 50 - 56 are each biased nonconductive.

Referring again to the system diagram of FIG. 4, the vehicle speed and engine tachometer input signals on lines 70 and 72 may be generated by conventional speed pickups SP1, SP2. Each signal comprises a series of pulses at a frequency directly related to the respective sensed speed. Each such signal is supplied as a digital input to an input counter IC1, IC2 of the computer-based control unit 30 via a conventional signal shaping circuit SS1, SS2.

The fuel level input information includes two analog signals: an ignition voltage (IGN) signal on line 78 and a fuel level signal on line 80. The ignition voltage (IGN) is connected across a potentiometer 82. The voltage at the potentiometer tap varies with the level of fuel in the vehicle fuel tank (not shown) and the tap is connected to the fuel level signal line 80. The ignition and fuel level signals are each supplied as inputs to an analog input port AD0, AD1 of the control unit 30 via a conventional filter circuit F1, F2. The control unit 30 computes the fuel level in the fuel tank in relation to the ratio of the fuel level signal to the ignition voltage signal.

The PWM duty cycle commands for coils $S_x$, $S_y$, $T_x$, $T_y$ and $F_y$ are generated by the control unit 30 as described below in reference to the flow diagrams of FIGS. 6–8 and are outputted to the PWM bipolar driver circuits 20–28 via the control unit output counters OC-1–OC5 and the lines 32–40. In a mechanization of the present invention, the function of the control unit 30 was performed with a MC68HC11 Single-Chip Microcontroller, manufactured by Motorola, Inc., Phoenix, AZ.

Figure 6:
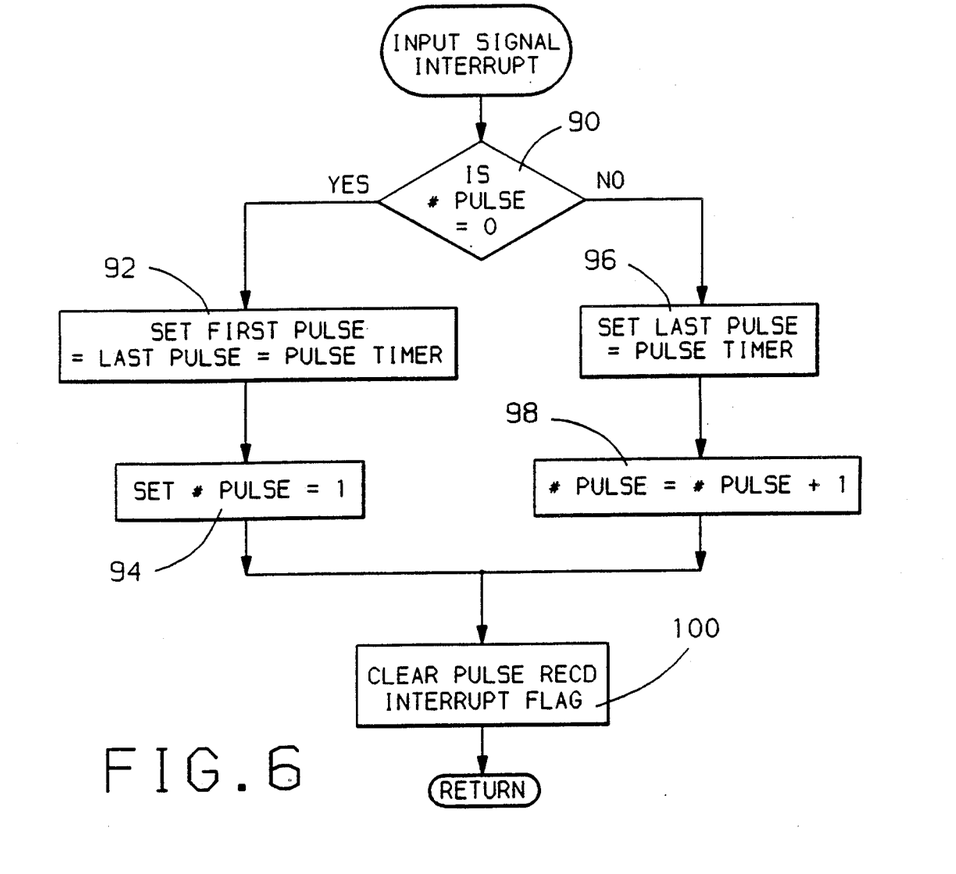
FIGS. 6, 7 and 8 are flow diagrams representative of computer program instructions executed by the computer-based controller of FIG. 4 in carrying out the control of this invention.
Figure 7:
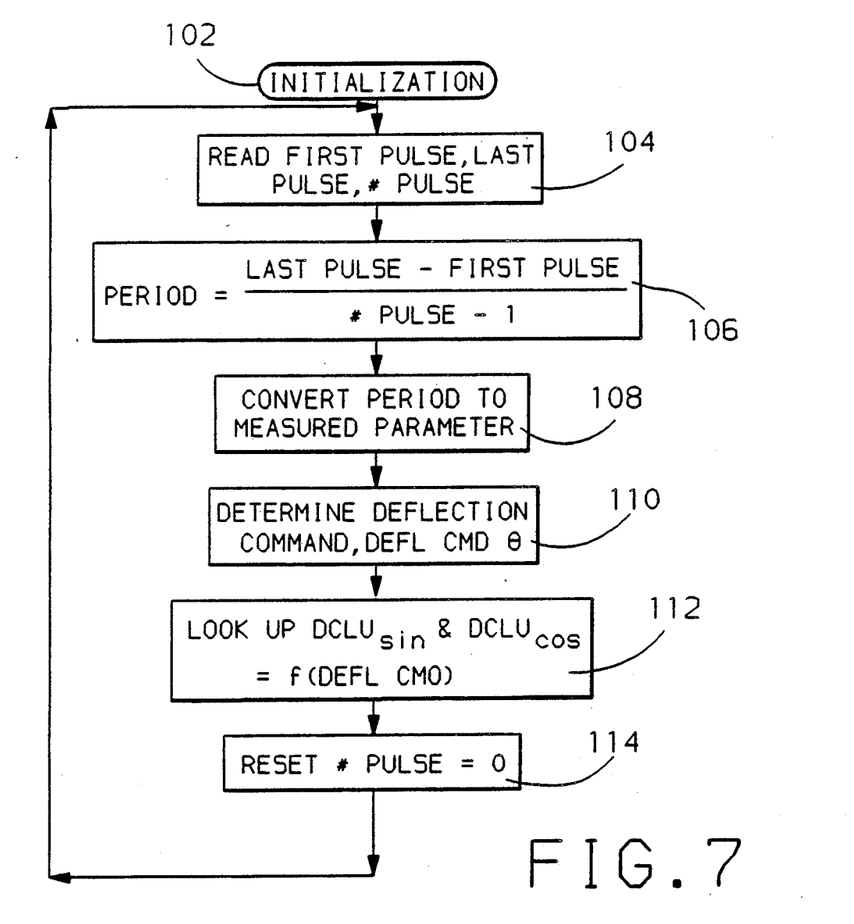
Figure 8:
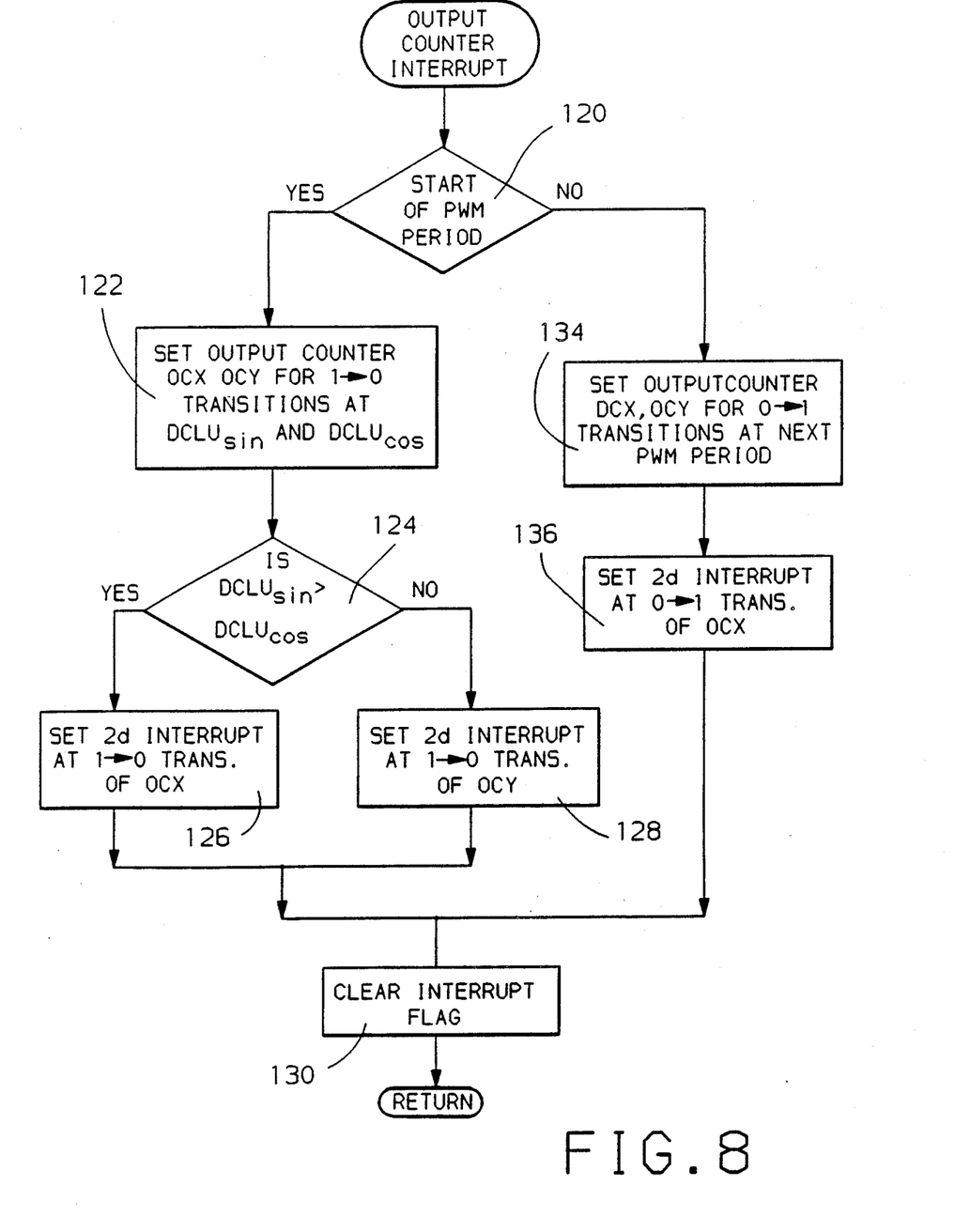

The flow diagrams of FIGS. 6–8 represent program instructions executed by the computer-based control unit 30 of FIG. 4 and are divided into three basic routines: an INPUT SIGNAL SAMPLING routine (FIG. 6) for accumulating information about the parameter which is to be displayed, an INFORMATION PROCESSING routine (FIG. 7) for processing the accumulated information and an OUTPUT RESPONSE GENERATION routine (FIG. 8) for generating PWM drive signals for the air core gauges. The INFORMATION PROCESSING routine is a background (main loop) routine, while the INPUT SIGNAL SAMPLING and OUTPUT RESPONSE GENERATION routines are interrupt triggered.

The INPUT SIGNAL SAMPLING routine of FIG. 6 samples the variable frequency input signals and uses a free-running clock (PULSE TIMER) to generate a digital count corresponding to the average elapsed interval (period) between successive pulses thereof. The input signals are applied to an edge triggering port of the control unit 30 which generates a PULSE RECEIVED INTERRUPT flag for executing the INPUT SIGNAL SAMPLING routine at the leading (or trailing) edge of each such pulse. The same routine is executed for both the speedometer and tachometer signals.

Averaging of the input signal period is achieved by allowing two or more edges to accumulate during each sampling period, if possible. The bookkeeping term #PULSE indicates the number of accumulated pulses. If the term #PULSE is equal to zero, as determined at decision block 90, the beginning of a sampling period is indicated. In such case, the instruction blocks 92 and 94 are executed to store the PULSE TIMER count in the terms FIRST PULSE and LAST PULSE and to increment the value of #PULSE to one. If the term #PULSE is at least one, the sampling period has already begun and the instruction blocks 96 and 98 are executed to store the PULSE TIMER count in LAST PULSE and to increment the value of #PULSE. In any case, the instruction block 100 is then executed to clear the PULSE RECEIVED INTERRUPT flag, completing the routine. In the course of a sampling period, the term LAST PULSE may be overwritten several times, depending on the input signal frequency.

As indicated above, the INFORMATION PROCESSING routine of FIG. 7 is a background routine that is repeatedly executed during operation of the vehicle. The INITIALIZATION block 102 represents a series of program instructions executed at the initiation of each period of vehicle operation for initializing the various flags, timers and variable terms of control unit 30.

Following initialization, the instruction blocks 104 and 106 are executed to read the values of the terms FIRST PULSE, LAST PULSE and #PULSE generated by the INPUT SIGNAL SAMPLING routine and to compute the average period (PERIOD) of the frequency inputs. As indicated at block 106, the term PERIOD (in timer counts) is determined according to the expression:

$$PERIOD = (LAST\ PULSE - FIRST\ PULSE)/(\#PULSE - 1)$$

The instruction blocks 108 and 110 are then executed to convert the term PERIOD to the measured parameter units (MPH, for example) and to determine the required pointer deflection to display the same. This requires knowledge of the timer count period (65531 counts/sec in the illustrated embodiment), the relation between the measured parameter and the frequency signal (in MPH/Hz, for example) and the scaling factor of the gauge (in degrees/MPH, for example). The commanded deflection DEFL CMD is then calculated by digitally filtering the deflection values to limit the commanded rate of change in pointer position.

Figure 3C:
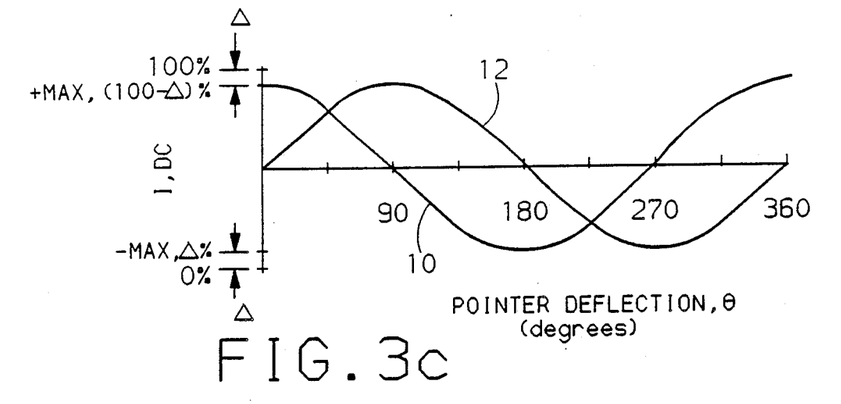

The table values for the commanded deflection DEFL CMD at looked up at instruction block 112 and represent PWM duty cycles (or on-times) as graphically depicted in FIG. 3c. In the illustrated embodiment, there are 8,192 output timer counts per PWM period, resulting in a table offset of 4,096 for 50% duty cycle. Algebraically, the sine and cosine duty cycle look-up values $DCLU_{sin}$ and $DCLU_{cos}$ are given by the expressions:

$$DCLU_{sin} = 4,096 + [SIN(DEFL) * (100 - 2DELTA) * 4,096]$$

$$DCLU_{cos} = 4,096 + [COS(DEFL) * (100 - 2DELTA) * 4,096]$$

If DELTA has a value of 5%, for example, a desired pointer deflection of 90 degrees corresponds to the following look-up values:

$$DCLU_{sin} = 7,782.4,\ or\ 95\%\ duty\ cycle$$

$$DCLU_{cos} = 4,096.0,\ or\ 50\%\ duty\ cycle$$

The instruction block 114 is then executed to reset the term #PULSES to zero for initializing the next sampling period, completing the INFORMATION PROCESSING routine.

The OUTPUT RESPONSE GENERATION routine of FIG. 8 generates PWM transitions corresponding to the look-up values determined by the INFORMATION PROCESSING routine. Like the INPUT SIGNAL SAMPLING routine, this routine is interrupt driven. In this case, however, the interrupts are generated by the PWM output counters of control unit 30. At the initiation of each period of operation, the INITIALIZATION block 102 of FIG. 7 sets up the output counters to turn on all of the coils and to generate a start-of-period interrupt. This signals the execution of the FIG. 8 flow diagram.

At the start-of-period interrupt, the decision block 120 is answered in the affirmative, and the instruction block 122 is executed to set up the output counters OCX and OCY to cause on-to-off PWM transitions for the X and Y coils in accordance with the $DCLU_{sin}$ and $DCLU_{cos}$ look-up values. Then, the blocks 124–130 are executed to define the conditions for the initiation of a second interrupt and to clear the interrupt flag. Specifically, the conditions are defined such that the second interrupt will occur at the on-to-off PWM transition of the coil having the higher duty cycle.

At second interrupt, the decision block 120 is answered in the negative and the instruction blocks 134, 136 and 130 are executed to set up off-to-on PWM transitions for start of the next period, to enable the next start-of-period interrupt and to clear the interrupt flag. At such interrupt, the decision block 120 is answered in the affirmative and the blocks 122–130 are executed as described above to schedule the on-to-off PWM transitions.

In the above manner, the control unit 30 pulse width modulates both coils of the speedometer and tachometer gauges S, T and one coil of the fuel gauge F. In each case, the use of the bipolar drivers with the PWM driver arrangement of this invention permits substantially distortion-free gauge operation with a computer-based controller. The value of DELTA is selected for each gauge to calibrate the resulting pointer alignment torque for adequate responsiveness without pointer jitter.

While this invention has been described in reference to the illustrated embodiment, it will be understood that various modifications may be made thereto and that systems incorporating such modifications may fall within the scope of this invention, which is defined by the appended claims.

The embodiments of the invention in which an exclusive property or privilege is claimed are defined as follows:

1. Drive apparatus for an air core gauge, comprising in combination:
   driver means for applying a bipolar direct voltage to at least one coil of said gauge to energize the coil with current of like polarity, the driver means alternately reversing the polarity of the applied voltage, and therefore the polarity of the energizing current, according to a PWM duty cycle control signal defining the percentage of time that voltage of one polarity is applied to said coil as compared to voltage of an opposite polarity; and
   computer-based control means for (1) synchronously receiving and processing input data related to a parameter to be displayed by said gauge, (2) determining a desired current for said coil for producing a desired deflection of said gauge, (3) generating a PWM duty cycle value in relation to said desired current such that duty cycles in the range of 0%–50% define a full range of desired current of said one polarity, and duty cycles in the range of 50%–100% define the full range of desired current of said opposite polarity, and (4) scaling the PWM duty cycle value into the range of (DELTA)% to (100-DELTA)% to form said PWM duty cycle control signal for said driver means, the term DELTA being defined in relation to the time required by said computer-based control means to receive and process said input data.

2. The improvement set forth in claim 1, wherein said PWM duty cycle control signal is determined substantially according to the expression:

$$50 + [f(DEFL) * 50 * (2DELTA)]$$

where f(DEFL) designates a sinusoidal function of a desired deflection DEFL, and the quantity (1-2-DELTA) represents a fractional scaling factor based on the term DELTA.

3. The improvement set forth in claim 1, wherein said driver means includes first and second means for independently energizing first and second coils of said air core gauge; and the control unit generates duty cycle values %DC$_1$ and %DC$_2$ for said first and second coils substantially according to the expressions:

%DC=50+[sin(DEFL) * 50 * (1−2DELTA)]

%DC=50+[cos(DEFL) * 50 * (1−2DELTA)]

where DEFL designates a desired deflection of the gauge, and the quantity (1−2DELTA) represents a fractional scaling factor based on the term DELTA.

4. The improvement set forth in claim 1, wherein the term DELTA is determined in relation to a force required to deflect the gauge to a desired deflection angle DEFL.

* * * * *